(12) United States Patent
Nagata

(10) Patent No.: US 6,441,621 B2
(45) Date of Patent: Aug. 27, 2002

(54) WAVEFORM OBSERVING JIG AND WAVEFORM OBSERVING DEVICE

(75) Inventor: Takahiro Nagata, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 28 days.

(21) Appl. No.: 09/725,159

(22) Filed: Nov. 29, 2000

(30) Foreign Application Priority Data

Nov. 29, 1999 (JP) ............................................ 11-338538

(51) Int. Cl.[7] ................................................. G01R 31/02
(52) U.S. Cl. ..................... 324/537; 324/158.1; 324/523; 324/754
(58) Field of Search ................................ 324/537, 522, 324/523, 754, 761, 158.1

(56) References Cited

U.S. PATENT DOCUMENTS

| | | | | |
|---|---|---|---|---|
| 4,551,673 A | * | 11/1985 | Barth et al. .................. | 324/758 |
| 4,565,966 A | * | 1/1986 | Burr et al. ................... | 324/519 |
| 5,006,808 A | * | 4/1991 | Watts .......................... | 324/537 |
| 5,023,545 A | * | 6/1991 | Marques ...................... | 324/759 |
| 5,187,430 A | * | 2/1993 | Marek et al. ................. | 324/66 |
| 5,198,756 A | * | 3/1993 | Jenkins et al. .............. | 324/757 |
| 5,266,901 A | * | 11/1993 | Woo ............................ | 324/537 |
| 5,625,292 A | * | 4/1997 | Crook et al. ................ | 324/538 |
| 6,097,202 A | * | 7/2000 | Takahashi ................... | 324/761 |

* cited by examiner

*Primary Examiner*—N. Le
*Assistant Examiner*—T. R. Sundaram
(74) *Attorney, Agent, or Firm*—Oliff & Berridge, PLC

(57) ABSTRACT

A waveform observing jig for observing a waveform of a signal outputted from a predetermined signal terminal, comprises: a contact for a signal, for contacting with a signal terminal of a board to be observed, and a plurality of contacts for a ground, for contacting with a ground pattern of the board to be observed, wherein at least one contact for a ground is in contact with the ground pattern of the board to be observed when the contact for a signal is in contact with a predetermined signal terminal of the board to be observed.

8 Claims, 4 Drawing Sheets

WAVEFORM OBSERVING JIG AND WAVEFORM OBSERVING DEVICE

BACKGROUND OF THE INVENTION

1. Field of the Invention

The present invention relates to a waveform observing jig and a waveform observing device, which are used for observing a waveform of a signal by an IC tester or the like.

2. Description of the Related Art

A waveform of a signal is tested by an IC tester or the like. A waveform observation or the like, for a timing calibration of a waveform signal is carried out. When such a waveform observation or the like is carried out, a board to be observed is used. A waveform observing jig 100 shown in FIG. 3 is used for observing a signal outputted from the board to be observed.

The waveform observing jig 100 shown in FIG. 3 comprises a contact 10 for a signal, a contact 20 for a ground (GND), a conductive block 40, an insulator 50 and a voltage probe 30. An oscilloscope 60 observes a waveform of a signal outputted from a board 1 to be observed through the waveform observing jig 100.

One contact 10 for a signal and one contact 20 for a GND are attached to the waveform observing jig 100 in order to observe a signal outputted from the board 1 to be observed. An end portion 10*a* of the contact 10 for a signal is in contact with a gold-plated pad 3 for a signal, to be measured, which is mounted on the board 1 to be observed. An end portion 20*a* of the contact 20 for a GND is in contact with a GND pattern 2 of the board 1 to be observed. By fetching a signal, the waveform observation is carried out by the oscilloscope 60.

The contact 10 for a signal is held by the insulator 50 provided in the conductive block 40. The contact 10 is insulated from the conductive block 40 by the insulator 50. The contact 10 for a signal is biased toward a lower direction in the figure by a spring or the like, which is not shown. When the end portion 10*a* of the contact 10 for a signal is in contact with the gold-plated pad 3 for a signal, the other end portion 10*b* of the contact 10 for a signal is in contact with an end portion 30*a* of the voltage probe 30.

The contact 20 for a GND is arranged on the conductive block 40 at a predetermined interval from the contact 10 for a signal so as to be in contact with the GND pattern 2 even when the contact 10 for a signal is in contact with any gold-plated pad 3.

A plurality of gold-plated pads 3-1, 3-2, ..., 3-n for a signal are arranged on the board 1 to be observed, so as to fetch a signal outputted from each electrode of an IC to be measured, where n is a natural number and a plurality of gold-plated pads are inclusively represented by gold-plated pads 3 for a signal. The arrangement of the gold-plated pads 3 for a signal is determined on the basis of an arrangement of lead pitches of an IC to be measured. That is, because each gold-plated pad 3 for a signal is arranged according to the lead pitches of an IC to be measured, each signal outputted from the lead pitches of an IC is outputted to the corresponding gold-plated pads 3 for a signal.

The distance from each gold-plated pad 3 for a signal to the GND pattern 2 differs according to the position of a gold-plated pad 3. Therefore, on the waveform observing jig 100, the contact 10 for a signal and the contact 20 for a GND are arranged so as to adjust their positions to a distance between the GND pattern 2 and the gold-plated pad 3 which is disposed the most apart from the GND pattern 2.

FIG. 4A shows a state in which the contact 10 for a signal is in contact with the gold-plated pad 3-1 for a signal. In FIG. 4A, when the contact 10 for a signal is in contact with the gold-plated pad 3-1 for a signal, to be measured, the contact 20 for a GND is in contact with a point 2-1 on the GND pattern 2. The point 2-1 is a reference point of the GND. Then, a signal outputted from the gold-plated pad 3-1 for a signal, that is, a signal outputted from a lead pitch of an IC, which corresponds to the gold-plated pad 3-1 for a signal, is measured.

FIG. 4B shows a state in which the contact 10 for a signal is in contact with the gold-plated pad 3-4 for a signal. In FIG. 4B, when the contact 10 for a signal is in contact with the gold-plated pad 3-4 for a signal, to be measured, the contact 20 for a GND is in contact with a point 2-4 on the GND pattern 2. The point 2-4 is a reference point of the GND. Then, a signal outputted from the gold-plated pad 3-4 for a signal, that is, a signal outputted from a lead pitch of an IC, which corresponds to the gold-plated pad 3-4 for a signal, is measured.

However, in the waveform observing jig 100 according to an earlier development, as shown in FIGS. 4A and 4B, when the contact 10 for a signal is in contact with every gold-plated pad 3 during the waveform observation, the contact 20 for a GND, which is disposed apart from the contact 10 for a signal at a constant distance, is in contact with the GND pattern 2 in order to set the reference point of the GND. Therefore, the inductance of the GND depends on the position of the gold-plated pad 3 for a signal, to be measured. As a result, there is some possibility that the inductance of the GND becomes large. The waveform of the observed signal is deteriorated. The timing error of the observed signal is caused.

Because the arrangement of the lead pitches differs according to the type of an IC to be measured, it is necessary that a board 1 to be observed, which has a different arrangement of the gold-plated pads 3 for a signal, should be prepared for every type of an IC.

Further, because it is necessary that the contact 10 for a signal and the contact 20 for a GND, of the waveform observing jig 100 should be arranged so as to adjust their positions to a distance between the GND pattern 2 and the gold-plated pad 3 which is disposed the most apart from the GND pattern 2, the waveform observing jig 100 which is suitable for the board 1 to be observed must be used. That is, it is necessary that the waveform observing jig 100 should be prepared according to the type of an IC to be measured.

SUMMARY OF THE INVENTION

In order to solve the above-described problems, an object of the present invention is to provide a waveform observing jig and a waveform observing device which can minimize the inductance of the GND in the board to be observed during the waveform observation, and can be adapted to various types of boards to be measured.

That is, in accordance with one aspect of the present invention, a waveform observing jig (for example, waveform observing jig 200, as shown in FIG. 1) for observing a waveform of a signal outputted from a predetermined signal terminal, comprises:

a contact for a signal (for example, contact 10 for a signal, as shown in FIG. 1), for contacting with a signal terminal (for example, gold-plated pad 3 for a signal, as shown in FIG. 1) of a board to be observed (for example, board 1 to be observed, as shown in FIG. 1), and a plurality of contacts for a ground (for example, contacts 20 for a GND, as shown in FIG. 1), for contacting with a ground pattern (for example, GND pattern 2, as shown in FIG. 1) of the board to be observed, wherein at least one contact for a ground is in contact with the ground pattern of the board to be observed when the contact for a signal is in contact with a predetermined signal terminal of the board to be observed.

According to the present invention, because the waveform observing jig comprises a plurality of contacts for a ground, when the contact for a signal is in contact with the predetermined signal terminal of the board to be observed, it is possible to observe a signal from the predetermined signal terminal by using a contact for a ground as a reference, which is the nearest to the contact for a signal in the contacts for a ground, connecting with the ground pattern of the board to be observed, that is, by using a contact for a ground as a reference, by which the inductance of the ground is minimized.

Therefore, it is possible to prevent the deterioration of the waveform of the observed signal and the time delay of the signal waveform. One waveform observing jig can be also used for a board to be observed, which has a different positional relationship between the signal terminal and the ground pattern, that is, a different type of board to be observed.

The plurality of contacts for a ground may be attached to one conductive object (for example, conductive block 40, as shown in FIG. 1).

According to the present invention, the plurality of contacts for a ground necessarily have the same electric potential because the contacts for a ground are attached to one conductive object. Because the waveform observing jig has the above structure, the contact for a ground, by which the inductance of the ground is minimized, necessarily becomes the reference of the ground.

The contact for a signal and the plurality of contacts for a ground may be arranged in a straight line.

According to the present invention, one waveform observing jig can be easily adapted to the boards to be observed, which have various sizes.

In accordance with another aspect of the present invention, a waveform observing jig for observing a waveform of a signal outputted from a-predetermined signal terminal, comprises:

a contact for a signal (for example, contact 10 for a signal, as shown in FIG. 1), for contacting with a signal terminal (for example, gold-plated pad 3 for a signal, as shown in FIG. 1) of a board to be observed (for example, board 1 to be observed, as shown in FIG. 1), a contact for a ground (for example, contact 20 for a GND, as shown in FIG. 1), for contacting with a ground pattern (for example, GND pattern 2, as shown in FIG. 1) of the board to be observed, and a plurality of attachment portions for attaching the contact for a ground detachably in a position in which the contact for a ground is in contact with the ground pattern.

According to the present invention, because the waveform observing jig comprises a plurality of attachment portions for attaching the contact for a ground, the contact for a ground can be attached to the attachment portion so as to minimize the inductance of the ground in all the attachment portions when the contact for a signal is in contact with the predetermined signal terminal of the board to be observed. As a result, a signal from the predetermined signal terminal can be observed by using the attached contact for a ground as a reference.

That is, it is possible to minimize the inductance of the ground in the board to be observed, and to prevent the deterioration of the waveform of the observed signal and the time delay of the signal waveform. One waveform observing jig can be also used for a board to be observed, which has a different positional relationship between the signal terminal and the ground pattern, that is, a different type of board to be observed.

When the contact for a signal is in contact with the signal terminal, the contact for a ground is attached to the attachment portion so as to minimize the inductance of the ground. Because the contact for a ground can be attached to every attachment portion, the waveform observation is satisfied with one contact for a ground. Further, because the contact for a ground is detachably attached to the attachment portion, the repair of the contact for a ground, the replacement thereof or the like can be easily carried out when the contact for a ground is damaged or the like.

In accordance with another aspect of the present invention, a waveform observing device comprises:

a waveform observing jig comprising a contact for a signal, for contacting with a signal terminal of a board to be observed, and a plurality of contacts for a ground, for contacting with a ground pattern of the board to be observed, wherein at least one contact for a ground is in contact with the ground pattern of the board to be observed when the contact for a signal is in contact with a predetermined signal terminal of the board to be observed, wherein a waveform of a signal outputted from the signal terminal of the board to be observed, through the waveform observing jig is observed.

According to the present invention, because the waveform observing jig comprises a plurality of contacts for a ground, it is possible to minimize the inductance of the ground in the board to be observed. Further, one waveform observing jig can be also used for a board to be observed, which has a different positional relationship between the signal terminal and the ground pattern, that is, a different type of board to be observed. Therefore, the waveform observing device can observe the waveform which is hardly deteriorated and is hardly time-delayed. Even when the waveform observation is carried out by using a different type of board to be observed, it is possible to carry out the waveform observation by using one waveform observing jig.

The plurality of contacts for a ground may be attached to one conductive object. The contact for a signal and the plurality of contacts for a ground may be arranged in a straight line.

In accordance with another aspect of the present invention, a waveform observing device comprises:

a waveform observing jig comprising a contact for a signal, for contacting with a signal terminal of a board to be observed, a plurality of contacts for a ground, for contacting with a ground pattern of the board to be observed, and a plurality of attachment portions for attaching the contacts for a ground detachably in a position in which the contact for a ground is in contact with the ground pattern, wherein a waveform of a signal outputted from the signal terminal of the board to be observed, through the waveform observing jig is observed.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

Hereinafter, an embodiment of the present invention will be explained in detail with reference to FIGS. 1 and 2.

Figure 1:
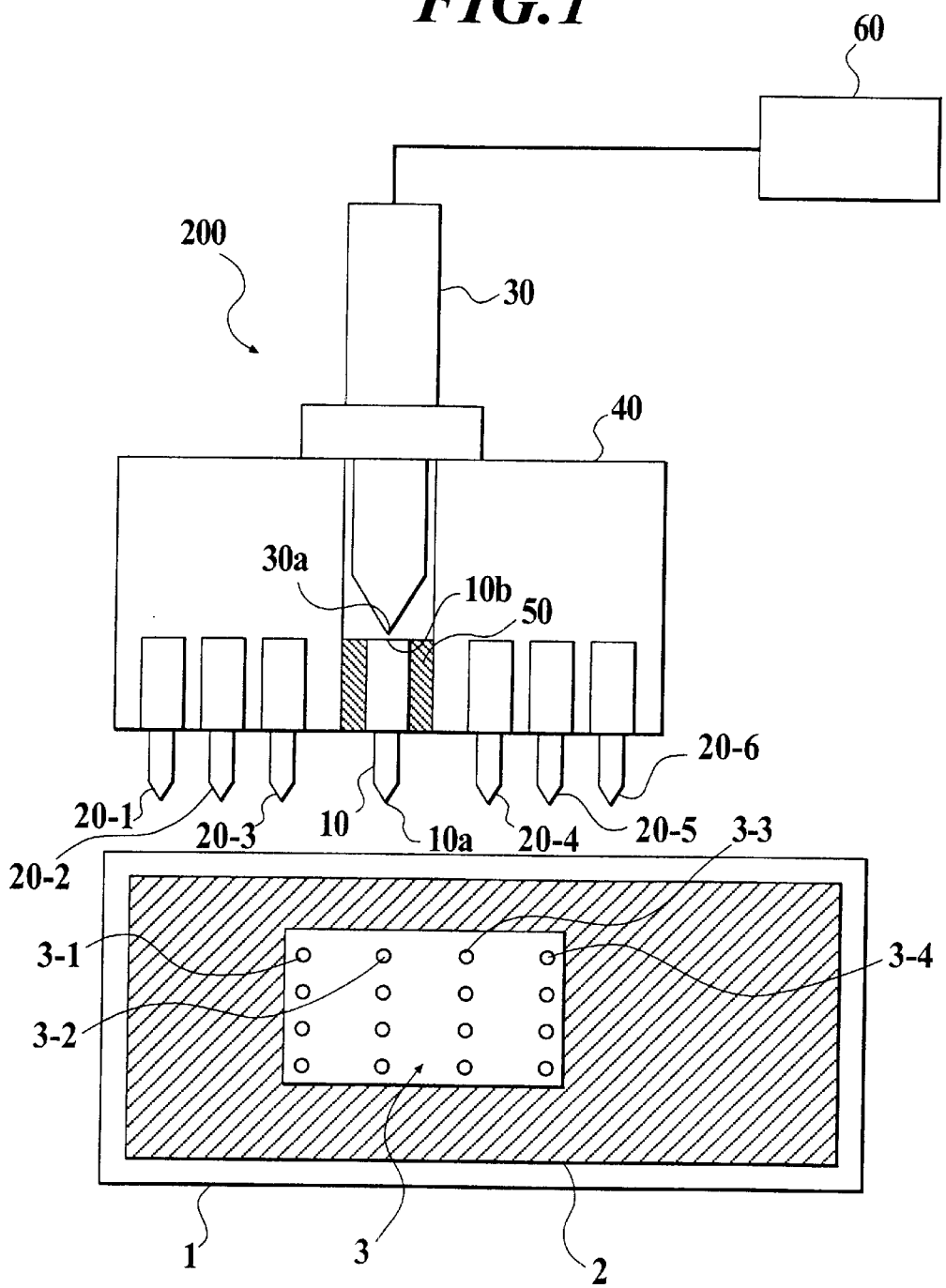
FIG. 1 is view showing an example of the structure of the waveform observing jig having a plurality of contacts for a GND.
Figure 3:
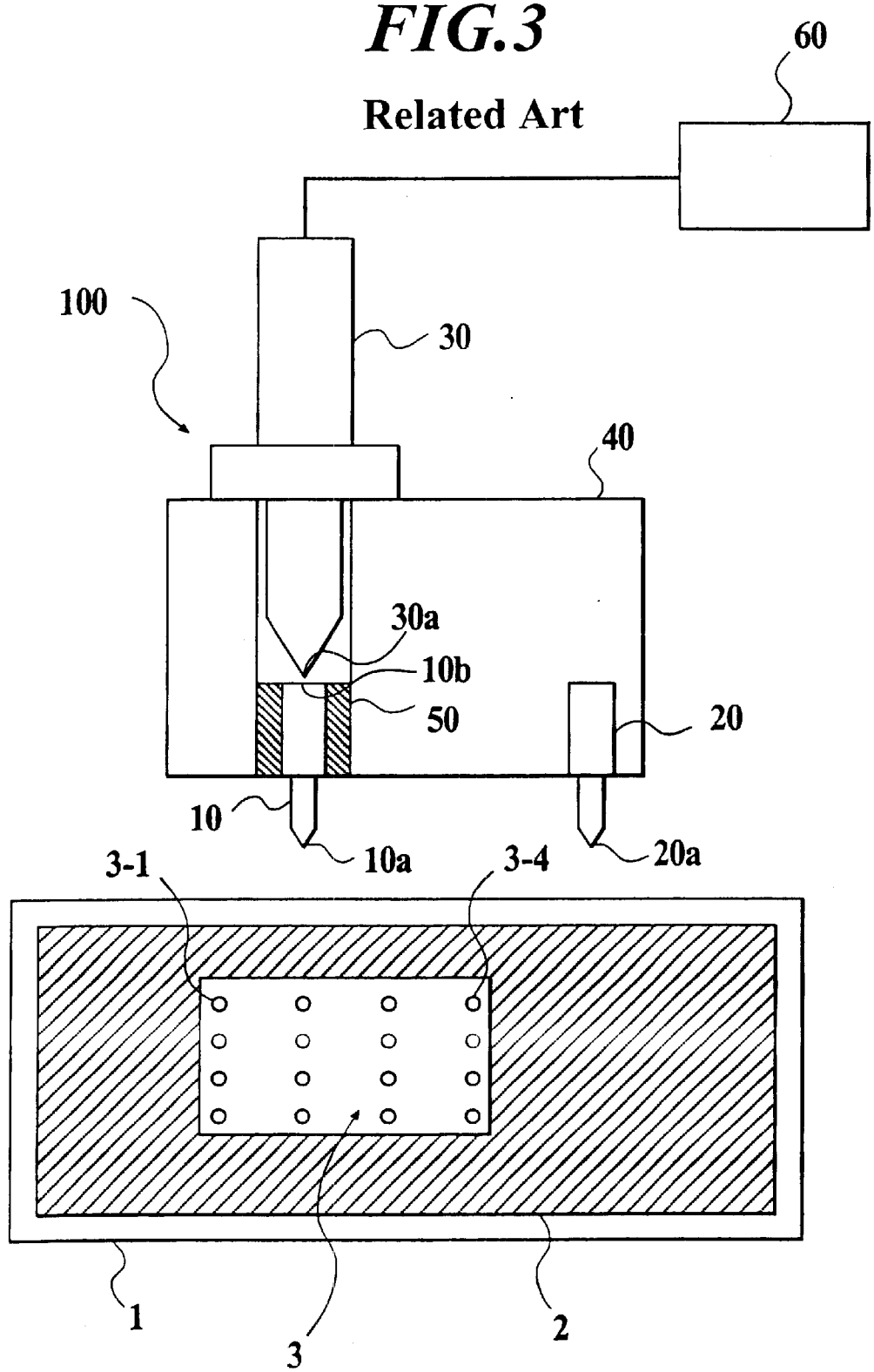
FIG. 3 is view showing the structure of the waveform observing jig according to an earlier development.
Figure 4A:
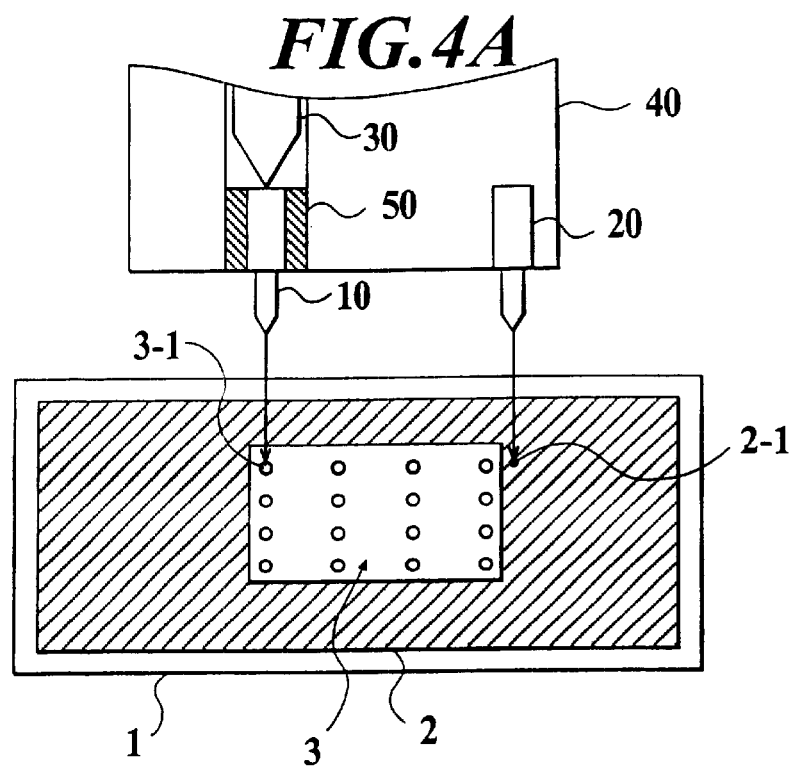
FIGS. 4A and 4B are views showing each state in which the contact for a signal is in contact with the gold-plated pad for a signal.
Figure 4B:
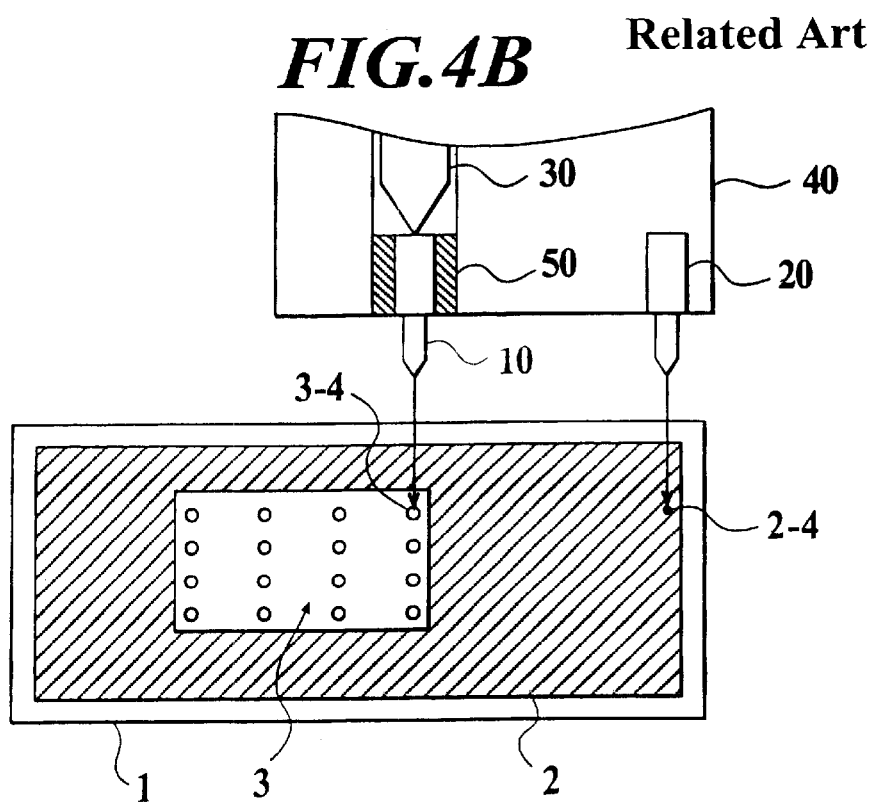

FIG. 1 is a view showing an example of the structure of the waveform observing jig 200 according to the embodiment of the present invention. In FIG. 1, the same elements as the waveform observing jig 100 of FIG. 3 according to an earlier development are denoted by the same reference numerals. The explanations thereof are omitted.

The difference between the waveform observing jig 200 according to the present embodiment and the waveform observing jig 100 according to an earlier development is that a plurality of contacts 20 for a GND are provided on the conductive block 40. The contact 20 for a GND in the waveform observing jig 200 is the same as the contact 20 for a GND in the waveform observing jig 100. The contact 10 for a signal and six contacts 20-1, 20-2, . . . , 20-6 for a GND (the six contacts being inclusively represented by contacts 20 for a GND) are arranged in a straight line on the conductive block 40 of the waveform observing jig 200.

Although the contact 10 for a signal and the contacts 20 for a GND are arranged in a straight line in this embodiment, the arrangement thereof is not limited to this. Another arrangement thereof may be adapted to the waveform observing jig.

The contacts 20 for a GND are provided on the conductive block 40 at predetermined intervals so that at least one or more contacts 20 for a GND are in contact with the GND pattern 2 when the contact 10 for a signal is in contact with any gold-plated pad 3 for a signal. All contacts 20 for a GND necessarily have the same electric potential because all contacts 20 for a GND are attached to one conductive block 40. Because all contacts 20 for a GND have the same electric potential, when the contact 10 for a signal is in contact with the gold-plated pad 3 to be measured, the contact 20 for a GND, which is the nearest to the contact 10 for a signal in the contacts 20 contacting with the GND pattern 2, that is, the contact 20 for a GND, by which the inductance of the GND is minimized, becomes the reference of the GND.

When the contact 10 for a signal is in contact with the gold-plated pad 3 for a signal, to be measured, there is some possibility that some of the contacts 20 for a GND are in contact with the gold-plated pads 3 for a signal, not to be measured.

However, because a signal is not outputted from the gold-plated pads 3 for a signal, not to be measured, the problems relating to the waveform observation are not caused even in case that there are some contacts 20 for a GND, which are in contact with the gold-plated pads 3 for a signal, not to be measured.

Next, with reference to FIG. 2, the operations of the waveform observing jig according to the present embodiment will be explained. FIG. 2 shows a state in which the contact 10 for a signal is in contact with the gold-plated pad 3-2 for a signal.

Figure 2:
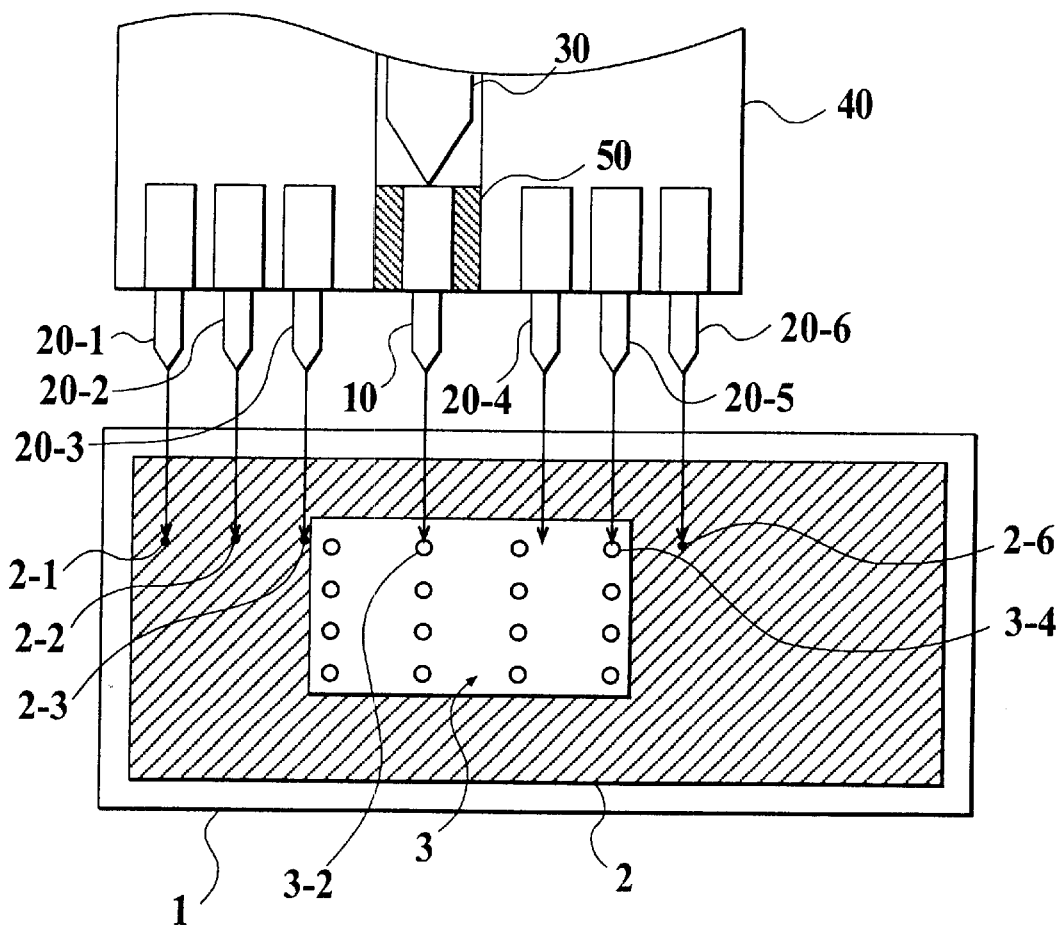
FIG. 2 is a view showing a state in which the contact for a signal is on contact with the gold-plated pad for a signal.

In FIG. 2, when the contact 10 for a signal is in contact with the gold-plated pad 3-2 for a signal, to be measured, the contact 20-5 for a GND is in contact with the gold-plated pad 3-4 for a signal, not to be measured. The contact 20-4 for a GND is in contact with an insulation portion separating the gold-plated pads 3 for a signal from the GND pattern 2. The other contacts 20-1, 20-2, 20-3 and 20-6 for a GND are in contact with the points 2-1, 2-2, 2-3 and 2-6 on the GND pattern 2, respectively. At this time, because a signal is not outputted from the gold-plated pads 3 for a signal except the gold-plated pad 3-2 for a signal, to be measured, a signal is not outputted to the contact 20-5 for a GND. Because the contact 20-4 for a GND is in contact with the insulation portion, a signal is not outputted to the contact 20-4 for a GND. That is, a signal is not inputted into the contacts 20-4 and 20-5 for a GND, which are not in contact with the GND pattern 2.

Because all contacts for a GND, which are provided on one conductive block have the same electric potential, the contact 20-3 for a GND, which is the nearest to the contact 10 for a signal in the contacts 20-1, 20-2, 20-3 and 20-6 contacting with the GND pattern 2, becomes the reference of the GND, reasonably. Then, a signal outputted from the gold-plated pad 3-2 for a signal is observed. That is, when a signal outputted from the gold-plated pads 3 is observed, the contact 20 for a GND, which minimizes the inductance of the GND, becomes the reference of the GND in order to observe a signal outputted from the gold-plated pad 3 for a signal.

As described above, because it is possible to observe a signal from the gold-plated pads 3 for a signal by preparing a plurality of contacts 20 for a GND, of the waveform observing jig 200 and by using the contact 20 for a GND as a reference, by which the inductance of the GND is minimized, it is possible to prevent the deterioration of the waveform of the observed signal and the time delay of the signal waveform.

Because a plurality of contacts 20 for a GND are prepared, one waveform observing jig 200 can be also used for a board to be observed, which has a different positional relationship between the gold-plated pads 3 for a signal and the GND pattern 2, that is, a different type of board to be observed.

Although the waveform observing jig having six contacts 20 for a GND is explained in the embodiment, the number of the contacts for a GND is not limited to six.

Although it is explained that the contacts 20 for a GND are provided on the conductive block 40 of the waveform observing jig 200, the conductive block 40 may comprise a plurality of attachment portions for attaching the contact 20 1for a GND detachably and the contact 20 for a GND may be attached to the attachment portion in the most suitable position for a contact between the contact 10 for a signal and the gold-plated pad 3 for a signal.

According to the present invention, it is possible to minimize the inductance of the ground in the board to be observed and to prevent the deterioration of the waveform of the observed signal and the time delay of the signal waveform. One waveform observing jig can be also used for a board to be observed, which has a different positional relationship between the signal terminal and the ground pattern, that is, a different type of board to be observed.

Further, because a plurality of contacts for a ground have the same electric potential, the contact for a ground, by which the inductance of the ground is minimized, becomes the reference of the ground.

One waveform observing jig can be easily adapted to the boards to be observed, which have various sizes.

According to the present invention, it is possible to minimize the inductance of the ground in the board to be observed, and to prevent the deterioration of the waveform of the observed signal and the time delay of the signal waveform. One waveform observing jig can be also used for a board to be observed, which has a different positional relationship between the signal terminal and the ground pattern, that is, a different type of board to be observed.

When the contact for a signal is in contact with the signal terminal, the contact for a ground is attached to the attachment portion so as to minimize the inductance of the ground. Because the contact for a ground can be attached to every attachment portion, the waveform observation is satisfied with one contact for a ground. Further, because the contact for a ground is detachably attached to the attachment portion, the repair of the contact for a ground, the replacement thereof or the like can be easily carried out when the contact for a ground is damaged or the like.

According to the present invention, because the waveform observing jig comprises a plurality of contacts for a ground, it is possible to minimize the inductance of the ground in the board to be observed. Further, one waveform observing jig can be also used for a board to be observed, which has a different positional relationship between the signal terminal and the ground pattern, that is, a different type of board to be observed. Therefore, the waveform observing device can observe the waveform which is hardly deteriorated and is hardly time-delayed. Even when the waveform observation is carried out by using a different type of board to be observed, it is possible to carry out the waveform observation by using one waveform observing jig.

The entire disclosure of Japanese Patent Application No. Tokugan-Hei 11-338538 filed on Nov. 29, 1999 including specification, claims drawings and summary are incorporated herein by reference in its entirety.

What is claimed is:

1. A waveform observing jig for observing each waveform of a plurality of signals outputted from a board to be observed, comprising:

a first contact, for contacting with a plurality of signal terminals of the board to be observed, one by one; and a plurality of second contacts for contacting with a ground pattern of the board to be observed, the plurality of second contacts being arranged so that one or more second contacts contact with the ground pattern when the first contact contacts with any one of the plurality of signal terminals, wherein when two or more second contacts contact with the ground pattern, a closest second contact which is the closest to the first contact among the contacting two or more second contacts, is used as a ground.

2. The waveform observing jig as claimed in claim 1, wherein the plurality of second contacts are attached to one conductive object.

3. The waveform observing jig as claimed in claim 1, wherein the first contact and the plurality of second contacts are arranged in a straight line.

4. A waveform observing jig for observing each waveform of a plurality of signals outputted from a board to be observed, comprising:

a first contact for contacting with a plurality of signal terminals of the board to be observed, one by one;

a second contact for contacting with a ground pattern of the board to be observed, and a plurality of attachment portions for attaching the second contact in a position in which the second contact is in contact with the ground pattern, the second contact being attachable to and detachable from any one of the plurality of attachment portions.

5. A waveform observing device comprising:

a waveform observing jig comprising a first contact for contacting with a plurality of signal terminals of a board to be observed, one by one, and a plurality of second contacts, for contacting with a ground pattern of the board to be observed, the plurality of second contacts being arranged so that one or more second contacts contact with the ground pattern when the first contact contacts with any one of the plurality of signal terminals, wherein when two or more second contacts contact with the ground pattern, a closest second contact which is the closest to the first contact among the contacting two or more second contacts, is used as a ground, wherein each waveform of a plurality of signals outputted from the plurality of signal terminals of the board to be observed, through the waveform observing jig is observed.

6. The waveform observing device as claimed in claim 5, wherein the plurality of second contacts are attached to one conductive object.

7. The waveform observing device as claimed in claim 5, wherein the first contact and the plurality of second contacts are arranged in a straight line.

8. A waveform observing device comprising:

a waveform observing jig comprising a first contact for contacting with a plurality of signal terminals of a board to be observed, one by one, a second contact for contacting with a ground pattern of the board to be observed, and a plurality of attachment portions for attaching the second contact in a position in which the second contact is in contact with the ground pattern, the second contact being attachable to and detachable from any one of the plurality of attachment portions, wherein each waveform of a plurality of signals outputted from the plurality of signal terminals of the board to be observed, through the waveform observing jig is observed.

* * * * *